(12) United States Patent
Mizushima

(10) Patent No.: US 9,685,446 B2
(45) Date of Patent: Jun. 20, 2017

(54) METHOD OF MANUFACTURING A SEMICONDUCTOR DEVICE

(71) Applicant: FUJI ELECTRIC CO., LTD., Kawasaki-shi (JP)

(72) Inventor: Tomonori Mizushima, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/147,951

(22) Filed: May 6, 2016

(65) Prior Publication Data

US 2016/0254264 A1 Sep. 1, 2016

Related U.S. Application Data

(62) Division of application No. 13/845,066, filed on Mar. 17, 2013, now Pat. No. 9,356,115.

(30) Foreign Application Priority Data

Mar. 19, 2012 (JP) ................................. 2012-062749

(51) Int. Cl.
*H01L 29/66* (2006.01)
*H01L 29/739* (2006.01)
(Continued)

(52) U.S. Cl.
CPC .......... *H01L 27/105* (2013.01); *H01L 21/266* (2013.01); *H01L 29/32* (2013.01); *H01L 29/66325* (2013.01); *H01L 29/66333* (2013.01); *H01L 29/66348* (2013.01); *H01L 29/66356* (2013.01); *H01L 29/7391* (2013.01);
(Continued)

(58) Field of Classification Search
CPC ......... H01L 29/66325; H01L 29/66348; H01L 29/7397; H01L 29/861
See application file for complete search history.

(56) References Cited

U.S. PATENT DOCUMENTS 6,323,509 B1 11/2001 Kusunoki
8,084,814 B2 12/2011 Nemoto et al.
(Continued)

FOREIGN PATENT DOCUMENTS

JP 2000-200906 A 7/2000
JP 2005-317751 A 11/2005
(Continued)

*Primary Examiner* — Christine Enad
(74) *Attorney, Agent, or Firm* — Rabin & Berdo, P.C.

(57) ABSTRACT

A method of manufacturing a semiconductor device includes preparing a light ion source, a first mask and a second mask. A side of a first region on a top surface of a semiconductor substrate is shielded by using the first mask. The top surface, with the side of the first region thereon being shielded with the first mask, is irradiated with light ions by operating the light ion source to introduce lattice defects at a specified depth on a side of a second region on the top surface. A side of the second region on a bottom surface of the semiconductor substrate is shielded by using the second mask. The bottom surface, with the side of the second region thereon being shielded with the second mask, is irradiated with light ions by operating the light ion source to introduce lattice defects at a specified depth on the side of the first region on the bottom surface.

13 Claims, 13 Drawing Sheets

(51) Int. Cl.
- *H01L 27/105* (2006.01)
- *H01L 29/861* (2006.01)
- *H01L 21/266* (2006.01)
- *H01L 29/32* (2006.01)

(52) U.S. Cl.
CPC ...... *H01L 29/7395* (2013.01); *H01L 29/7397* (2013.01); *H01L 29/861* (2013.01)

(56) References Cited

U.S. PATENT DOCUMENTS

| | | |
|---|---|---|
| 8,952,449 B2 | 2/2015 | Koyama et al. |
| 2005/0258493 A1 | 11/2005 | Aono et al. |
| 2007/0231973 A1 | 10/2007 | Ruething et al. |
| 2008/0132048 A1 | 6/2008 | Barthelmess et al. |
| 2009/0224284 A1 | 9/2009 | Nemoto |
| 2009/0242931 A1 | 10/2009 | Tsuzuki et al. |
| 2009/0278166 A1 | 11/2009 | Soeno et al. |
| 2011/0124160 A1 | 5/2011 | Nemoto |
| 2012/0043582 A1* | 2/2012 | Koyama ............... H01L 21/263 257/140 |
| 2012/0132955 A1 | 5/2012 | Saito et al. |
| 2012/0286288 A1 | 11/2012 | Hussein et al. |
| 2013/0001639 A1 | 1/2013 | Iwasaki et al. |

FOREIGN PATENT DOCUMENTS

| | | |
|---|---|---|
| JP | 2009-272550 A | 11/2009 |
| JP | 2011-129619 A | 6/2011 |
| JP | 2012-043891 A | 3/2012 |

\* cited by examiner

METHOD OF MANUFACTURING A SEMICONDUCTOR DEVICE

CROSS REFERENCE TO RELATED APPLICATIONS

This is a divisional of U.S. application Ser. No. 13/845,066, filed on Mar. 17, 2013, and allowed on Feb. 4, 2016. Furthermore, this application claims the foreign priority benefit of Japanese application number JP PA 2012-062749, filed Mar. 19, 2012. The disclosures of these prior applications are incorporated herein by reference.

BACKGROUND OF INVENTION

1. Field of the Invention

The present invention relates to a method of manufacturing a semiconductor device.

2. Background Art

For power semiconductor devices, semiconductor devices such as IGBTs (Insulated Gate Bipolar Transistors) and Diodes are publicly known each with a breakdown voltage of 600V, 1200v or more. Such power semiconductor devices are used for electric power converters such as converters and inverters. In an electric power converter, an IGBT is used as a switching device and a diode is used for bypassing and freewheeling a current when the IGBT is turned-off.

An IGBT and a diode each formed as a discrete semiconductor component are generally combined to form a device. Recently, however, an RC-IGBT (Reverse Conducting IGBT) is proposed in which an IGBT and a FWD (Free Wheeling Diode) are formed on the same semiconductor substrate. FIG. 13 is a cross sectional view schematically showing a related RC-IGBT as a related semiconductor device. As is shown in FIG. 13, the related RC-IGBT has a configuration in which IGBT regions 100 and a diode region 110 are provided together on the same semiconductor substrate.

In the related RC-IGBT, on the top surface of the semiconductor substrate to be an n-drift region 101, an insulated gate of a MOS (Metal-Oxide-Semiconductor) structure is provided which is formed of a $p^+$-base region 102, an emitter region 103, a gate insulator 104 and a gate electrode 105. A $p^+$-base region provided in the diode region 110 is an anode region 112. The $p^+$-base region 102 and the emitter region 103 have an emitter electrode 106 in contact therewith. The emitter electrode 106 is also in contact with the anode region 112 to function as an anode electrode.

On the bottom surface of the semiconductor substrate to be the n-drift region 101, the IGBT region 100 is provided with a $p^+$-collector region 107 and the diode region 110 is provided with an $n^+$-cathode region 117. The $p^+$-collector region 107 is in contact with a collector electrode 108. The collector electrode 108 is in contact with the $n^+$-cathode region 117 and functions as a collector electrode. By providing an IGBT and a diode in the same semiconductor substrate in this way, the device can be downsized and provided with a lowered cost compared with the case in which discrete components are used in combination.

For such an RC-IGBT, the following device is proposed. In the device, an emitter side structure is formed on the top principal surface side of a silicon substrate, an n-type buffer layer is formed on the bottom principal surface side, a p-type collector layer is formed in the principal surface of the n-type buffer layer, an n-type cathode region is selectively formed with a spacing apart from the p-type collector layer, a metal collector electrode is formed so as to be in contact with the p-type collector layer, a metal cathode electrode is formed so as to be in contact with the n-type cathode region and a part of the n-type buffer layer, and a diode is arranged as a current inhibiting device between the cathode electrode and a collector terminal (see JP-A-2000-200906, for example).

Moreover, for an RC-IGBT with lifetime control of carriers (hereinafter simply referred to as a lifetime control) in an n-drift region being carried out, the following device is proposed. The device is a reverse conducting semiconductor device having an insulated gate bipolar transistor and a commutating diode integrally formed in a substrate of a first conduction type semiconductor, in which device the commutating diode includes the second conduction type base layer and the first conduction type base layer of the insulated gate bipolar transistor, an emitter electrode on one surface of the substrate is made to be an anode electrode, a collector electrode on the other surface of the substrate is made to be a cathode electrode, and in a part of the first conduction type base layer, a short lifetime region is formed in which the lifetime of the carrier is shorter compared with the lifetimes of carriers in other first conduction type base layers (see JP-A-2005-317751, for example).

Furthermore, for another RC-IGBT with lifetime control being carried out, the following device is proposed. The device is a semiconductor device having an IGBT device region and a diode device region presented together in the same semiconductor substrate, in which device a short lifetime region shortening the lifetime of holes is formed in a region at least a part of a drift layer in the diode device region, which makes an averaged value of the lifetime of the holes in the drift layer including the short lifetime region is shorter in the diode device region than in the IGBT device region (see JP-A-2009-272550, for example).

In addition, for a method of lifetime control of an RC-IGBT, the following method is proposed. The method includes the material wafer preparing step, the crystal defect forming step and the mask layer removing step (see JP-A-2011-129619, for example).

In the material wafer preparing step, a material wafer is prepared which has an element forming layer the material of which is semiconductor, a mask layer provided on the bottom surface side of the element forming layer and having an opening section, and a boundary layer provided between the element forming layer and the mask layer and formed of a material different from the material of the element forming layer and the material of the mask layer.

In the crystal defect forming step, crystal defects are formed in the device forming layer by carrying out irradiation with charged particles from the bottom surface side of the mask layer.

In the mask layer removing step, the boundary layer is removed by carrying out etching using etching material reacting with the boundary layer and reacting with no element forming layer.

However, the optimum condition of an IGBT and that of a diode are different from each other. Therefore, there is a problem in that it is difficult to form an RC-IGBT with the optimum condition provided for each of the IGBT and the diode formed together in the same semiconductor substrate. The reason is that the ideal carrier concentration distribution in a turned-on operation of an IGBT and that of a diode formed together with the IGBT in the same semiconductor substrate are different from each other. The ideal carrier concentration distribution in a turned-on operation of the IGBT and that of the diode are as follows.

An IGBT is desirably made to have such a carrier concentration distribution that the carrier concentration on the emitter side becomes higher than the carrier concentration on the collector side at the turned-on operation. For that, in an IGBT, for example, the lifetime of the carriers on the emitter side is preferably longer than the lifetime of the carriers on the collector side. The reason is that the carrier concentration on the collector side made to be lower than that on the emitter side when an IGBT is turned-off can lower the concentration of residual carriers ejected when a depletion layer expands from the emitter side toward the collector side at switching to thereby lower the turn-off loss.

While, a diode is desirably made to have such a carrier concentration distribution that the carrier concentration on the anode side (the emitter side of the IGBT) becomes lower than the carrier concentration on the collector side (the collector side of the IGBT) at the turned-on operation. For that, in a diode, the lifetime of the carriers on the anode side is preferably shorter than the lifetime of the carriers on the cathode side. The reason is that the carrier concentration on the anode side made to be lower reduces the peak of a reverse current at the reverse recovery of the diode to permit soft recovery. This reduces noise at switching.

In each of JP-A-2005-317751, JP-A-2009-272550 and JP-A-2011-129619, it is described that an n-drift region is irradiated by light ions to locally form a region with short lifetime carriers to thereby carry out lifetime control. In JP-A-2005-317751, however, there is described that a region with short lifetime carriers is uniformly provided from an IGBT region to an FWD region in an n-drift region. Therefore, when the lifetime of the carriers on the anode side of the diode is shortened, the lifetime of the carriers on the emitter side of the IGBT is also shortened to result in an increase in the on-voltage of the IGBT. Moreover, when the lifetime of the carriers on the collector side of the IGBT is shortened, the lifetime of the carriers on the cathode side of the diode is also shortened to cause hard recovery at switching, which results in an increase of noise.

In JP-A-2009-272550, it is described that only the lifetime control of a diode is carried out. Therefore no lifetime control of an IGBT is carried out. This will cause difficulty in lowering a turn-off loss. In JP-A-2011-129619, it is described that the bottom surface of a semiconductor is irradiated by helium (He) ions to shorten the lifetime of the carriers on the anode side of a diode at the top surface side of the semiconductor substrate. This will cause the cathode side of the diode to be also irradiated by the helium ions to also result in shortened lifetime of the carriers on the cathode side of the diode. Therefore, it is impossible to carry out lifetime control under the optimum condition for the diode. In this way, with the methods described in JP-A-2005-317751, JP-A-2009-272550 and JP-A-2011-129619, it is impossible to carry out lifetime control under the optimum condition for each of the IGBT and the diode.

It is an object of the invention to provide a method of manufacturing a semiconductor device capable of improving switching characteristic thereof for solving the problems in the related device explained in the foregoing.

SUMMARY OF THE INVENTION

For solving the problems explained in the foregoing and achieving the object of the invention, a method of manufacturing a semiconductor device according to a first aspect of the invention is a method of manufacturing a semiconductor device including a first semiconductor element provided in a first region in a semiconductor substrate, and a second semiconductor element provided in a second region in the semiconductor substrate, which method is characterized as follows. First, the preparing step is carried out which prepares a light ion source, a first mask and a second mask. Then, the first shielding step is carried out which shields the side of the first region on the top surface of the semiconductor substrate by using the first mask. Next, the first irradiating step is carried out which irradiates the top surface of the semiconductor substrate, the side of the first region thereon being shielded with the first mask, with light ions by operating the light ion source to introduce lattice defects at a specified depth on the side of the second region on the top surface of the semiconductor substrate. Following this, the second shielding step is carried out which shields the side of the second region on the bottom surface of the semiconductor substrate by using the second mask. Subsequent to this, the second irradiating step is carried out which irradiates the bottom surface of the semiconductor substrate, the side of the second region thereon being shielded with the second mask, with light ions by operating the light ion source to introduce lattice defects at a specified depth on the side of the first region on the bottom surface of the semiconductor substrate.

The method of manufacturing a semiconductor device according to a second aspect of the invention is, in the first aspect of the invention explained in the foregoing, characterized in that in the first irradiating step, a carrier lifetime on the side of the top surface element structure of the second semiconductor element is made shorter than a carrier lifetime on the side of the top surface element structure of the first semiconductor element.

The method of manufacturing a semiconductor device according to a third aspect of the invention is, in the first or the second aspect of the invention explained in the foregoing, characterized in that in the second irradiating step, a carrier lifetime on the side of the bottom surface element structure of the first semiconductor element is made shorter than a carrier lifetime on the side of the bottom surface element structure of the second semiconductor element.

The method of manufacturing a semiconductor device according to a fourth aspect of the invention is, in the second aspect of the invention explained in the foregoing, characterized as follows. Namely, the semiconductor substrate is a semiconductor substrate of a first conduction type which is provided with an insulated gate structure as the top surface element structure of the first semiconductor element, the insulated gate structure including a base region of a second conduction type, an emitter region of the first conduction type and a gate electrode. Moreover, the semiconductor substrate of the first conduction type is provided with an anode region of the second conduction type as the top surface element structure of the second semiconductor element. In addition, in the first irradiating step, the carrier lifetime on the side of the anode region is made shorter than the carrier lifetime on the side of the emitter region.

The method of manufacturing a semiconductor device according to a fifth aspect of the invention is, in the fourth aspect of the invention explained in the foregoing, characterized as follows. Namely, the semiconductor substrate of the first conduction type is provided with a cathode region of the first conduction type as the bottom surface element structure of the second semiconductor element. Moreover, in the first irradiating step, the carrier lifetime on the side of the anode region is made shorter than the carrier lifetime on the side of the cathode region.

The method of manufacturing a semiconductor device according to a sixth aspect of the invention is, in the third aspect of the invention explained in the foregoing, characterized as follows. Namely, the semiconductor substrate of the first conduction type is provided with a collector region of the second conduction type as the bottom surface element structure of the first semiconductor element. The semiconductor substrate of the first conduction type is also provided with a cathode region of the first conduction type as the bottom surface element structure of the second semiconductor element. Moreover, in the second irradiating step, the carrier lifetime on the side of the collector region is made shorter than the carrier lifetime on the side of the cathode region.

The method of manufacturing a semiconductor device according to a seventh aspect of the invention is, in the sixth aspect of the invention explained in the foregoing, characterized as follows. Namely, the semiconductor substrate of the first conduction type is provided with the insulated gate structure as the top surface element structure of the first semiconductor element, the insulated gate structure including a base region of a second conduction type, an emitter region of the first conduction type and a gate electrode. Moreover, in the second irradiating step, the carrier lifetime on the side of the collector region is made shorter than the carrier lifetime on the side of the emitter region.

Moreover, for solving the problems explained in the foregoing and achieving the object of the invention, a method of manufacturing a semiconductor device according to an eighth aspect of the invention is a method of manufacturing a semiconductor device including a first semiconductor element provided in a first region in a semiconductor substrate, and a second semiconductor element provided in a second region in the semiconductor substrate, which method is characterized as follows. First, the preparing step is carried out which prepares a light ion source and a mask. Then, the shielding step is carried out which shields the side of the first region on the top surface of the semiconductor substrate by using the mask. Next, the first irradiating step is carried out which irradiates the top surface of the semiconductor substrate, the side of the first region thereon being shielded with the mask, with light ions by operating the light ion source to introduce lattice defects at a specified depth on the side of the second region on the top surface of the semiconductor substrate. Following this, the second irradiating step is carried out which irradiates the bottom surface of the semiconductor substrate with light ions by operating the light ion source to introduce lattice defects at a specified depth on the bottom surface of the semiconductor substrate.

The method of manufacturing a semiconductor device according to a ninth aspect of the invention is, in the eighth aspect of the invention explained in the foregoing, characterized in that in the first irradiating step, a carrier lifetime on the side of the top surface element structure of the second semiconductor element is made shorter than a carrier lifetime on the side of the top surface element structure of the first semiconductor element.

The method of manufacturing a semiconductor device according to a tenth aspect of the invention is, in the eighth or the ninth aspect of the invention explained in the foregoing, characterized in that in the second irradiating step, a carrier lifetime on the side of the bottom surface element structure of the first semiconductor element is made shorter than a carrier lifetime on the side of the bottom surface element structure of the second semiconductor element so that the carrier lifetime on the side of the bottom surface element structure of the second semiconductor element is kept in a state of being longer than the carrier lifetime on the side of the top surface element structure of the second semiconductor element after the first irradiating step.

The method of manufacturing a semiconductor device according to an eleventh aspect of the invention is, in the ninth aspect of the invention explained in the foregoing, characterized as follows. Namely, the semiconductor substrate is a semiconductor substrate of a first conduction type which is provided with an insulated gate structure as the top surface element structure of the first semiconductor element, the insulated gate structure including a base region of a second conduction type, an emitter region of the first conduction type and a gate electrode. Moreover, the semiconductor substrate of the first conduction type is provided with an anode region of the second conduction type as the top surface element structure of the second semiconductor element. In addition, in the first irradiating step, the carrier lifetime on the side of the anode region is made shorter than the carrier lifetime on the side of the emitter region.

The method of manufacturing a semiconductor device according to a twelfth aspect of the invention is, in the eleventh aspect of the invention explained in the foregoing, characterized as follows. Namely, the semiconductor substrate of the first conduction type is provided with a cathode region of the first conduction type as the bottom surface element structure of the second semiconductor element. Moreover, in the first irradiating step, the carrier lifetime on the side of the anode region is made shorter than the carrier lifetime on the side of the cathode region.

The method of manufacturing a semiconductor device according to a thirteenth aspect of the invention is, in the tenth aspect of the invention explained in the foregoing, characterized as follows. Namely, the semiconductor substrate of the first conduction type is provided with a collector region of the second conduction type as the bottom surface element structure of the first semiconductor element. The semiconductor substrate of the first conduction type is also provided with a cathode region of the first conduction type as the bottom surface element structure of the second semiconductor element. Moreover, in the second irradiating step, the carrier lifetime on the side of the collector region is made shorter than the carrier lifetime on the side of the cathode region.

The method of manufacturing a semiconductor device according to a fourteenth aspect of the invention is, in the thirteenth aspect of the invention explained in the foregoing, characterized as follows. Namely, the semiconductor substrate of the first conduction type is provided with the insulated gate structure as the top surface element structure of the first semiconductor element, the insulated gate structure including a base region of a second conduction type, an emitter region of the first conduction type and a gate electrode. Moreover, in the second irradiating step, the carrier lifetime on the side of the collector region is made shorter than the carrier lifetime on the side of the emitter region.

The method of manufacturing a semiconductor device according to a fifteenth aspect of the invention is, in any one of the first to the seventh aspects of the invention explained in the foregoing, characterized in that in each of the first irradiating step and the second irradiating step, the irradiation is carried out with a particle beam of protons or helium ions.

The method of manufacturing a semiconductor device according to a sixteenth aspect of the invention is, in any one of the eighth to the fourteenth aspects of the invention explained in the foregoing, characterized in that in each of the first irradiating step and the second irradiating step, the irradiation is carried out with a particle beam of protons or helium ions.

According to the invention explained in the foregoing, a region in which a carrier lifetime is short can be formed at a specified depth on the side of the second region on the top surface of the semiconductor substrate, and a region in which a carrier lifetime is short can be formed at a specified depth on the side of the first region on the bottom surface of the semiconductor substrate. This can actualize an RC-IGBT with a configuration in which the carrier concentration on the emitter side of the IGBT region becomes higher than the carrier concentration on the collector side, and the carrier concentration on the anode side of the FWD region becomes lower than the carrier concentration on the cathode side.

With the method of manufacturing a semiconductor device according to the invention, the advantage of enabling the improvement of a switching characteristic is provided.

BRIEF DESCRIPTION OF THE SEVERAL VIEWS OF THE DRAWINGS

A brief description of the several views of the drawings as required by 37 CFR 1.74 and 37 CFR 1.77 follows below.

DESCRIPTION OF THE PREFERRED EMBODIMENT

Figure 1:
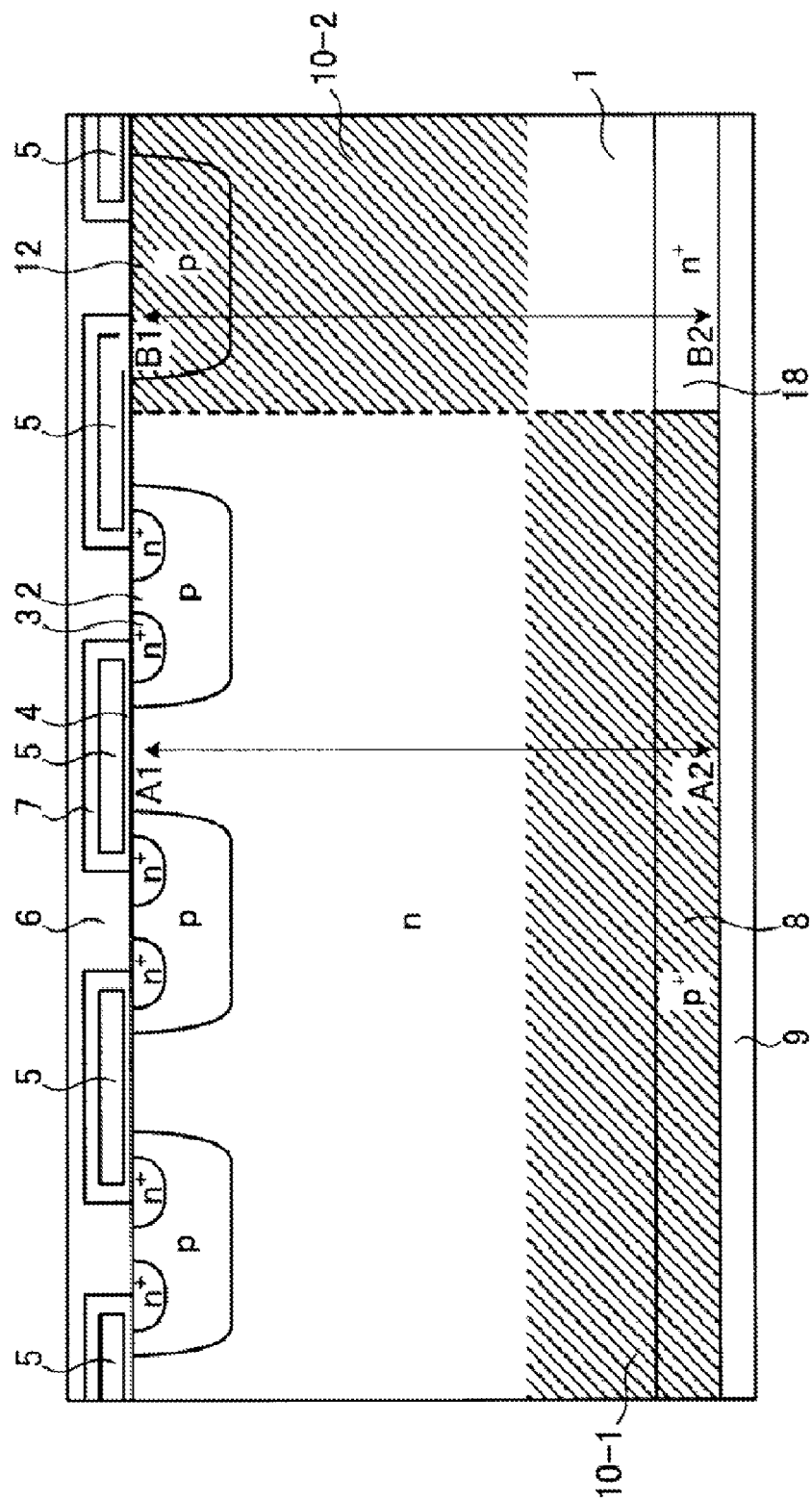
FIG. 1 is a cross sectional view showing a semiconductor device according to an embodiment 1.

In the following, the preferred embodiment of the method of manufacturing a semiconductor device according to the invention will be explained in detail with reference to the attached drawings. In the specification and the attached drawings, a leading character "n" attached to the name of a layer or a region means that electrons are major carriers in the layer or the region and a leading character "p" attached to the name of a layer or a region means that holes are major carriers in the layer or the region. Moreover, a sign "+" attached to the leading character "n" or "p" means that the impurity concentration in the layer or the region is higher than that in the layer or the region without the sign and a sign "−" attached to the leading character "n" or "p" means that the impurity concentration in the layer or the region is lower than that in the layer or the region without the sign. Furthermore, in the following explanations of the embodiments and the attached drawings, similar configurations are denoted with the same reference numerals and signs with redundant explanations omitted.

(Embodiment 1)

FIG. 1 is a cross sectional view showing a semiconductor device according to an embodiment 1. FIG. 2 is a set of characteristic diagrams showing ideal carrier concentration distributions when the semiconductor device according to the embodiment 1 is in turned-on operation. The semiconductor device according to the embodiment 1 shown in FIG. 1 is an RC-IGBT in which a planar gate IGBT and an FWD are provided in the same semiconductor substrate. As is shown in FIG. 1, an IGBT region A1-A2 and a diode region (hereinafter referred to as FWD region) B1-B2 are provided together in the same semiconductor substrate.

In the IGBT region A1-A2, in a semiconductor substrate to be an n-drift region 1, a plurality of p-base regions 2 are selectively provided in a surface layer on the top surface side. In each of the p-base regions 2, two $n^+$-emitter regions 3 are selectively provided so as to be exposed on the top surface of the semiconductor substrate. On the surface of a part of each of the p-base regions 2 between the n-drift region 1 and each of the $n^+$-emitter regions 3, a gate electrode 5 is provided with a gate insulator 4 put in between.

In contact with each of the p-base regions 2 and each of the $n^+$-emitter regions 3, an emitter electrode 6 is provided thereon. The emitter electrode 6 is electrically insulated from the gate electrode 5 with an interlayer dielectric 7 provided in between. In the semiconductor substrate, a $p^+$-collector region 8 is provided in the surface layer on the bottom surface side thereof. In contact with the $p^+$-collector region 8, a collector electrode 9 is provided.

The p-base region provided in the FWD region B1-B2 functions as an anode region 12. In the p-base region to be the anode region 12, no $n^+$-emitter region 3 is provided for preventing a malfunction due to the MOS structure. The emitter electrode 6 in contact with the anode region 12 functions as an anode electrode. In the FWD region B1-B2, an $n^+$-cathode region 18 is selectively provided in the $p^+$-collector region 8 so as to penetrate the $p^+$-collector region 8 from the n-drift region 1 toward the collector electrode 9. The collector electrode 9 in contact with the $n^+$-cathode region 18 functions as a cathode electrode.

On the collector side A2 of the IGBT region A1-A2, a region 10-1 in which the lifetime of carriers is controlled so as to become short (hereinafter referred to as a first lifetime control region—a hatched section in the IGBT region A1-A2 in FIG. 1) is provided. The lifetime of carriers in the first lifetime control region 10-1 is shorter than the lifetime of carriers on the emitter side A1 of the IGBT region A1-A2 and the lifetime of carriers on the cathode side B2 of the FWD region B1-B2. The first lifetime control region 10-1 is provided in the n-drift region 1 with a specified depth from the boundary between the $p^+$-collector region 8 and the collector electrode 9. The first lifetime control region 10-1 can be provided only in the $p^+$-collector region 8, for example.

On the anode side B1 of the diode region B1-B2, a region 10-2 in which the lifetime of carriers is controlled so as to become short (hereinafter referred to as a second lifetime control region—a hatched section in the FWD region B1-B2 in FIG. 1) is provided. The lifetime of carriers in the second lifetime control region 10-2 is shorter than the lifetime of carriers on the emitter side A1 of the IGBT region A1-A2 and the lifetime of carriers on the cathode side B2 of the FWD region B1-B2.

The second lifetime control region 10-2 is provided in the n-drift region 1 with a specified depth from the top surface of the semiconductor substrate. The depth of the second lifetime control region 10-2 is preferably a depth of the order of 10% to 70% of the thickness of the semiconductor substrate. The reason is as follows. This is because the depth of the second lifetime control region 10-2 less than the 10% of the thickness of the semiconductor substrate increases a loss at the reverse recovery of the diode, and the depth of the second lifetime control region 10-2 more than the 70% of the thickness of the semiconductor substrate causes hard recovery at the reverse recovery of the diode to increase noises at switching.

Figure 2A:
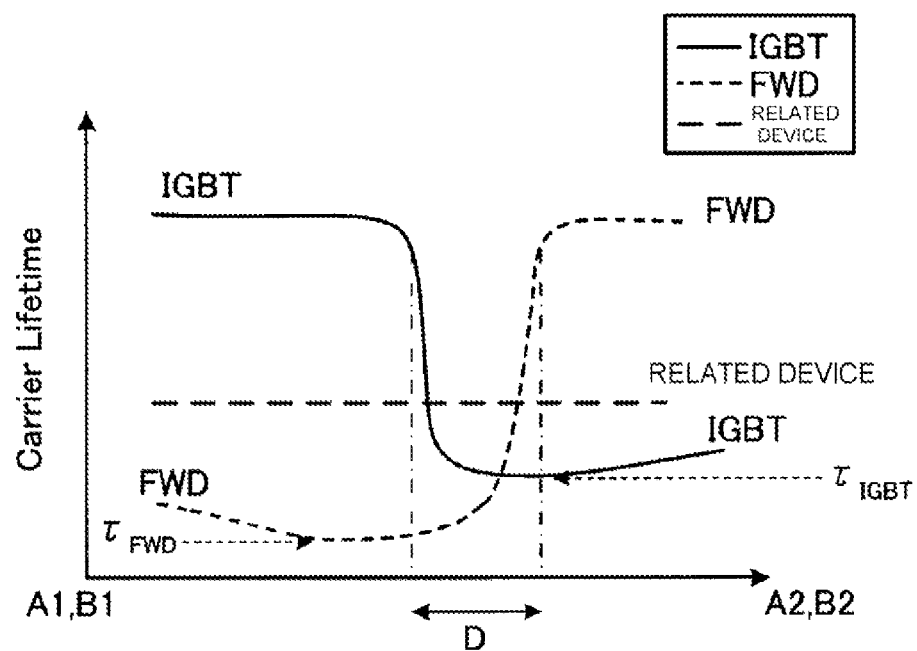
FIG. 2A and FIG. 2B are a set of characteristic diagrams showing ideal carrier concentration distributions when the semiconductor device according to the embodiment 1 is in a turned-on operation.

Namely, as shown in the diagram in of FIG. 2A, in the IGBT region A1-A2, the lifetime of carriers distributes so as to be long on the emitter side A1 and become short on the way to the collector side A2 so that the carrier concentration in turned-on operation comes to have a profile which is high on the emitter side A1 of the n-drift region 1 and low on the collector side A2 of the n-drift region 1. While, in the FWD region B1-B2, the lifetime of carriers distributes so as to be short on the anode side B1 (emitter side of the IGBT) and become long on the way to the cathode side B2 (collector side of the IGBT) so that the carrier concentration in turned-on operation has a profile which is low on the anode side B1 and high on the cathode side B2. Therefore, the RC-IGBT according to the embodiment 1 can actualize ideal carrier concentration distributions respectively for the IGBT and the FWD therein which distributions could not be achieved by a related RC-IGBT (hereinafter referred to as related device) in which a region with a short lifetime of carriers is uniformly provided from the IGBT region to the FWD region as is shown by a broken line in FIGS. 2A and 2B.

As is shown in the diagram in FIG. 2A, at a specified depth in the n-drift region 1, a "depth region" D may be formed in which the lifetime of carriers is shortened in both of the IGBT region A1-A2 and the FWD region B1-B2. This can provide the advantage of inhibiting interference occurring at the boundary region of the IGBT region A1-A2 and the FWD region B1-B2 between the currents in their respective regions. In the case of the lifetime distributions shown in the diagram in FIG. 2A, the decrease in the minimum lifetime value $\tau_{IGBT}$ in the IGBT region A1-A2 down to the level equivalent to the level of the minimum lifetime value $\tau_{FWD}$ in the FWD region B1-B2 will cause possible excessive increase in the on-voltage of the IGBT. Thus, in this case, the value of $\tau_{IGBT}$ can be determined as $\tau_{IGBT} > \tau_{FWD}$.

Figure 2B:
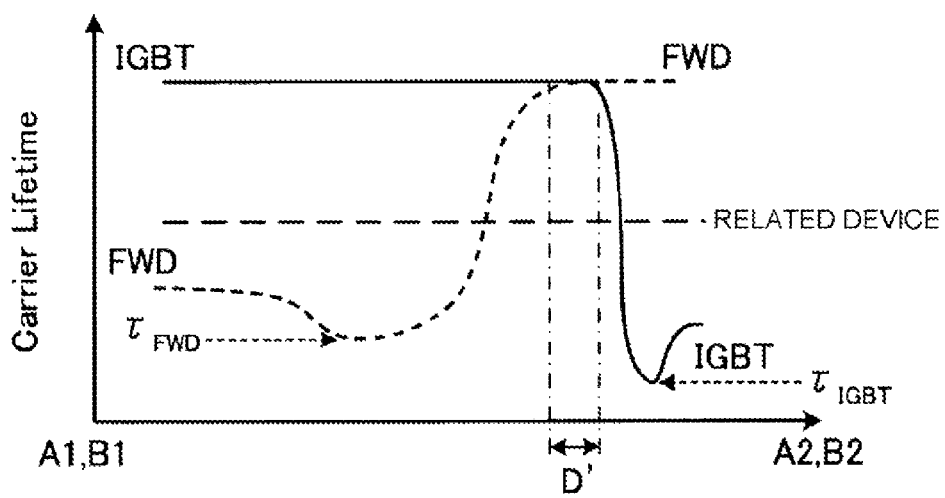

Instead of this, as is shown in the diagram in FIG. 2B, at a specified depth in the n-drift region 1, a "depth region" D' may be formed in which the lifetime of carriers is long in both of the IGBT region A1-A2 and the FWD region B1-B2. Here, the region where a lifetime is "long" is a region into which no crystal defect for the purpose of lifetime control is introduced to thereby provide a lifetime with the value thereof becoming the ideal value of a silicon substrate (10 μs or more, for example). By providing such distribution, carriers stored in the IGBT region A1-A2 in an on-state can be made to be less susceptible to the influence of the crystal defects in the FWD region B1-B2, by which the advantage of inhibiting an increase in an on-voltage can be obtained. Moreover, with the lifetime distribution, when a region is formed in which the lifetime of carriers is locally short particularly only in the vicinity of the pn-junction of the $p^+$-collector region 8 and the n-drift region 1 in the IGBT region A1-A2 and when the minimum lifetime value $\tau_{IGBT}$ in the IGBT region A1-A2 is determined with respect to the minimum lifetime value $\tau_{FWD}$ in the FWD region B1-B2 as $\tau_{IGBT} < \tau_{FWD}$, a trade-off between an on-voltage and a turn-off loss can be improved without the influence of crystal defects on the FWD region B1-B2.

Figure 3:
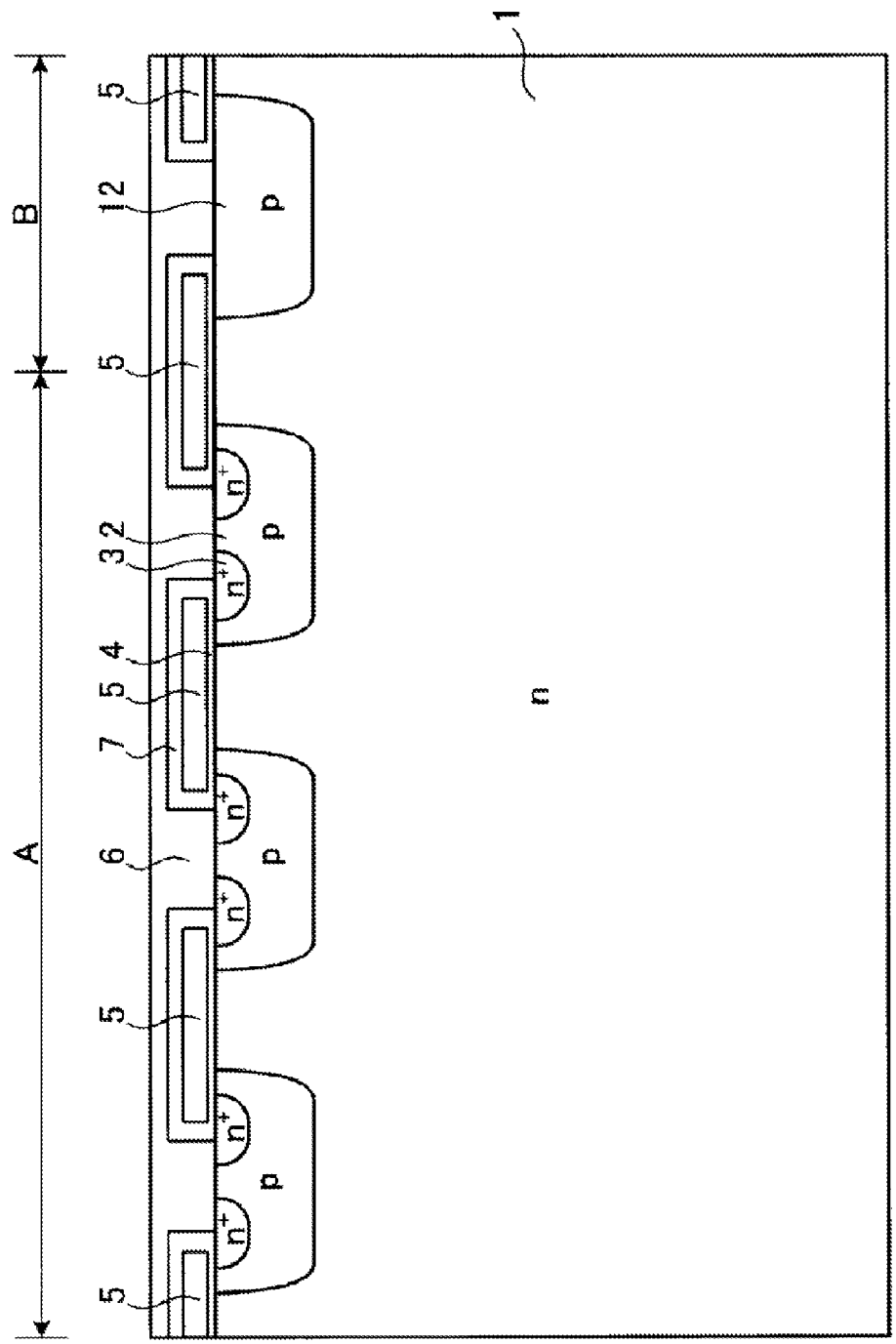
FIG. 3 is a cross sectional view showing the semiconductor device according to the embodiment 1 in being manufactured.

Next, a method of manufacturing of the semiconductor device according to the embodiment 1 shown in FIG. 1 will be explained. FIG. 3 to FIG. 9 are cross sectional views showing the semiconductor device according to the embodiment 1 in being manufactured in order of manufacturing step. Signs A and B in FIGS. 3 to 9 designate the IGBT region A1-A2 and the FWD region B1-B2 shown in FIG. 1, respectively. First, as shown in FIG. 3, on the top surface of the semiconductor substrate to be the n-drift region 1, MOS structures are formed by a general method. Each of the MOS structure is formed of the p-base region 2 in the IGBT region A, the $n^+$-emitter region 3, the gate insulator 4 and the gate electrode 5. The anode region 12 in the FWD region B is simultaneously formed with the p-base regions 2 in the IGBT region A. Moreover, the emitter electrode 6 is formed which is in contact with the p-base regions 2, the $n^+$-emitter regions 3 and the anode region 12.

Figure 4:
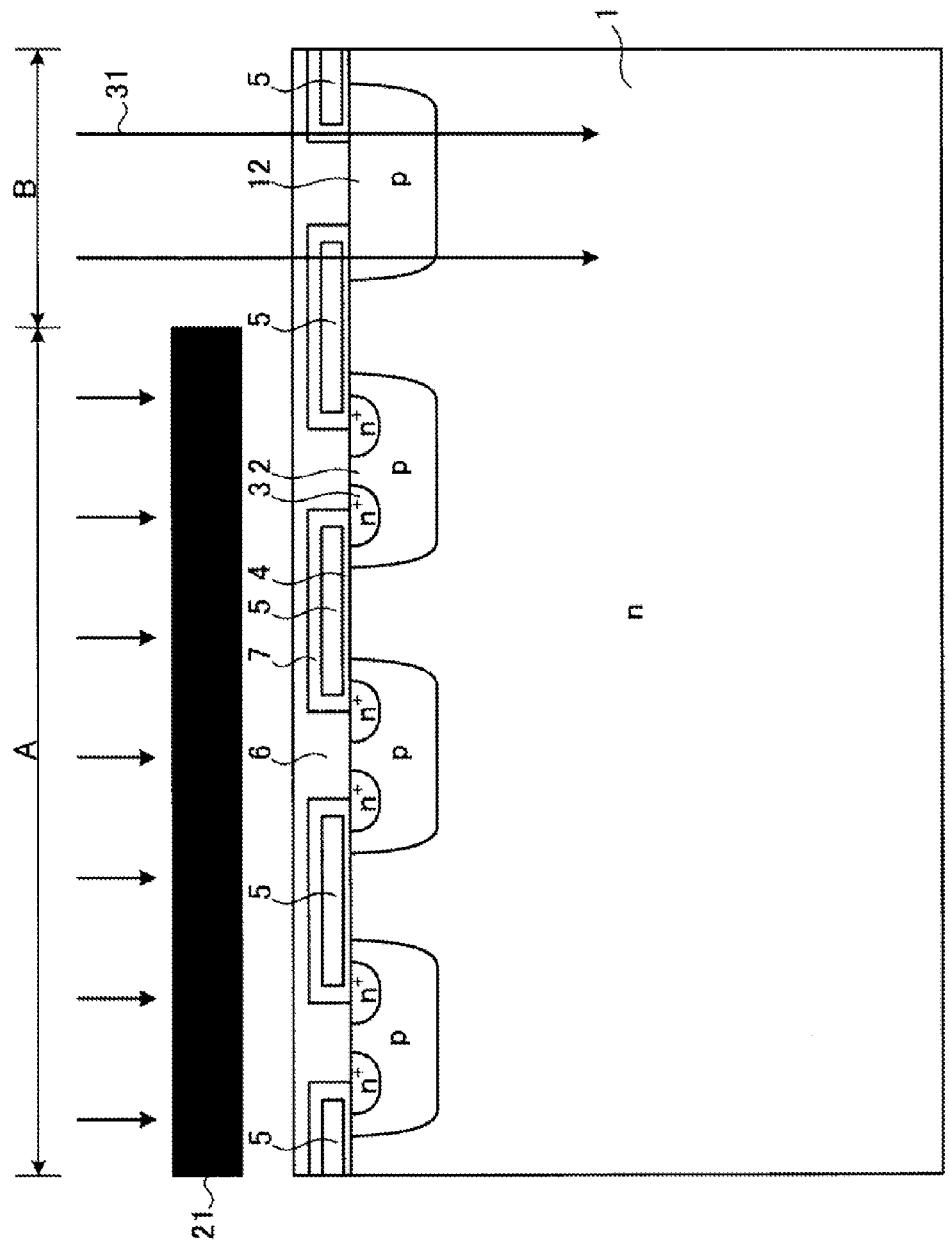
FIG. 4 is a cross sectional views showing the semiconductor device according to the embodiment 1 in being manufactured in the step subsequent to the step shown in FIG. 3.

Following this, as shown in FIG. 4, a first shielding mask 21 is arranged above the top surface of the semiconductor substrate with a specified spacing, for example, apart from the semiconductor substrate to shield the IGBT region A side on the top surface of the semiconductor substrate by the first shielding mask 21. The first shielding mask 21 is made of a plate-like metallic material such as aluminum, for example. The first shielding mask 21 has an opening pattern (not shown) formed to be opened in stripe-like and in dot-like, for example, according to the plane layout in the FWD region B. The reason to form the first shielding mask 21 with aluminum is that the first shielding mask 21 of aluminum activated by light ion irradiation to be an aluminum radioisotope exhibits a higher effect of radioactive decay compared with those of other activated metals. It is necessary only that the first shielding mask 21 irradiated with light ions is made to have a thickness allowing no light ions to reach the semiconductor substrate through the first shielding mask 21. The thickness can be 0.5 mm or more, for example.

Subsequent to this, with the use of the first shielding mask 21, only the FWD region B is irradiated with light ions 31 such as protons (H+) or helium (He) ions. This introduces lattice defects to be lifetime killers to a specified depth from the top surface of the semiconductor substrate only in the FWD region B. The IGBT region A shielded by the first shielding mask 21 is irradiated with no light ions 31. At this time, the acceleration voltage when carrying out the irradiation with the light ions 31 is adjusted so that the light ions 31 reach the specified depth in the semiconductor substrate. However, when the acceleration voltage is determined so that the light ions 31 reached the specified depth in the semiconductor substrate form a concentration distribution curve having a desired half width there, some shapes of the concentration distribution curves cause the range of the light ions 31 to exceed the specified depth. In this case, an absorber can be additionally used for adjusting the range of the light ions 31 so as not to exceed the desired depth. The absorber is a plate-like component made of a metal such as aluminum.

Figure 5:
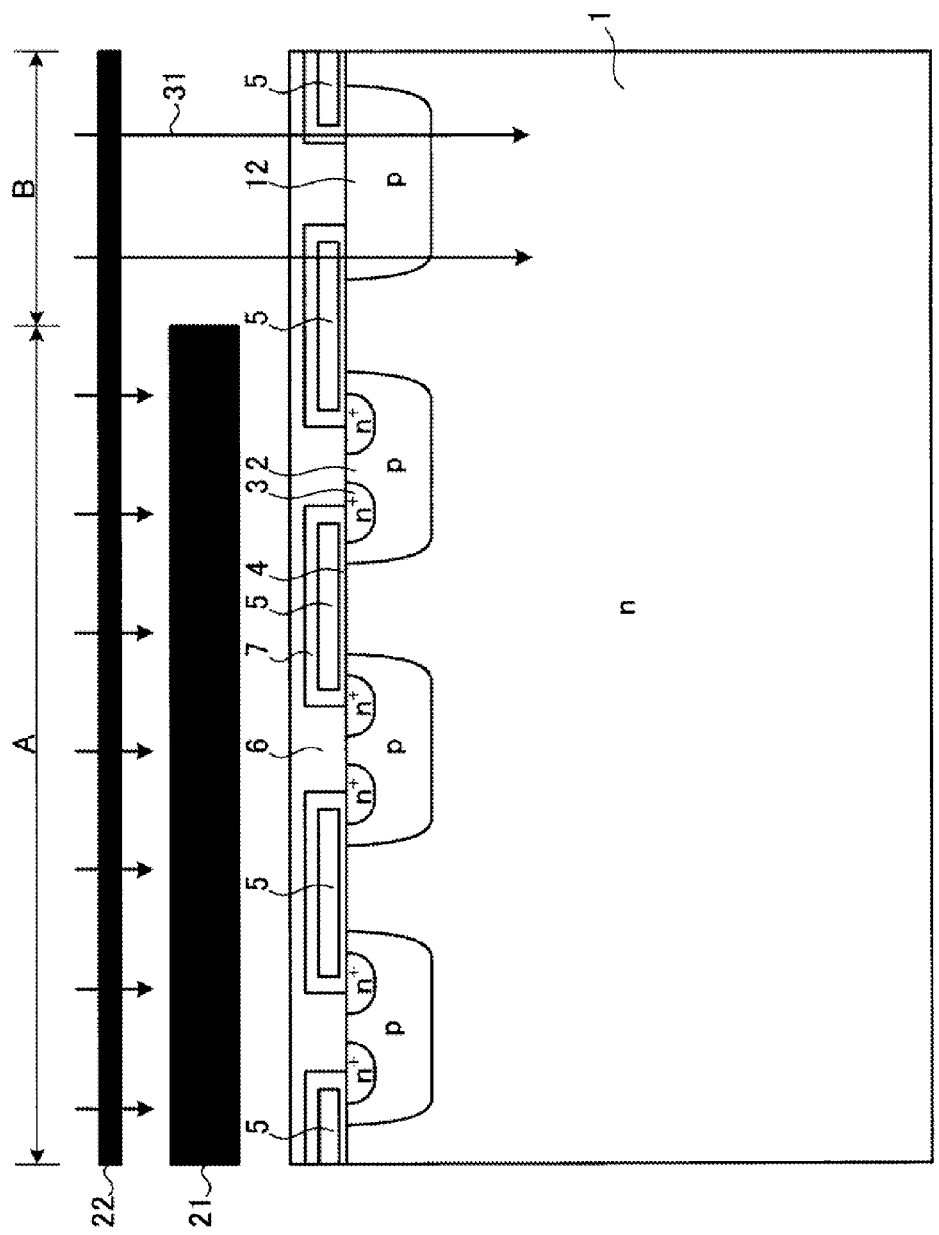
FIG. 5 is a cross sectional view showing the semiconductor device according to the embodiment 1 in being manufactured in the step subsequent to the step shown in FIG. 4.
Figure 6:
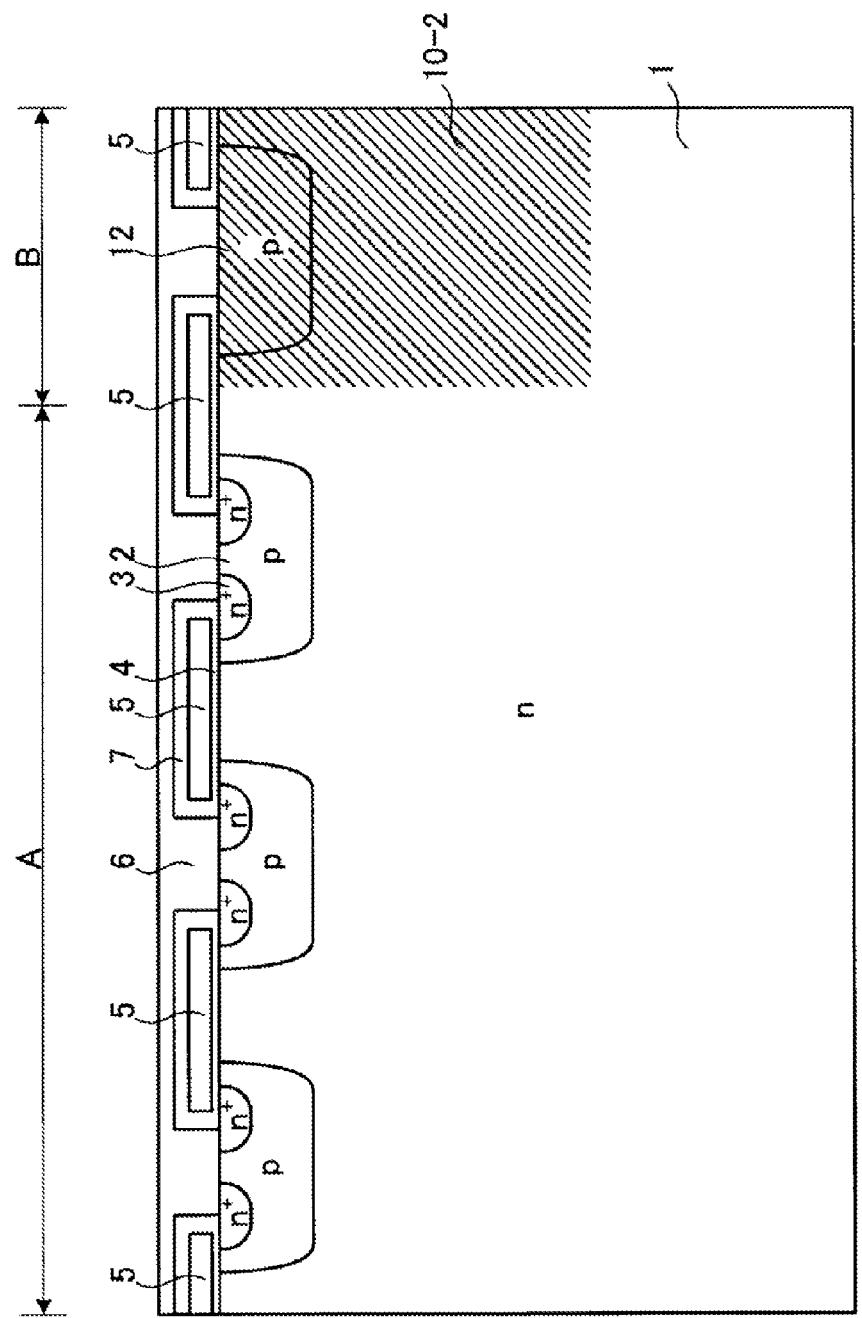
FIG. 6 is a cross sectional view showing the semiconductor device according to the embodiment 1 in being manufactured in the step subsequent to the step shown in FIG. 5.
Figure 7:
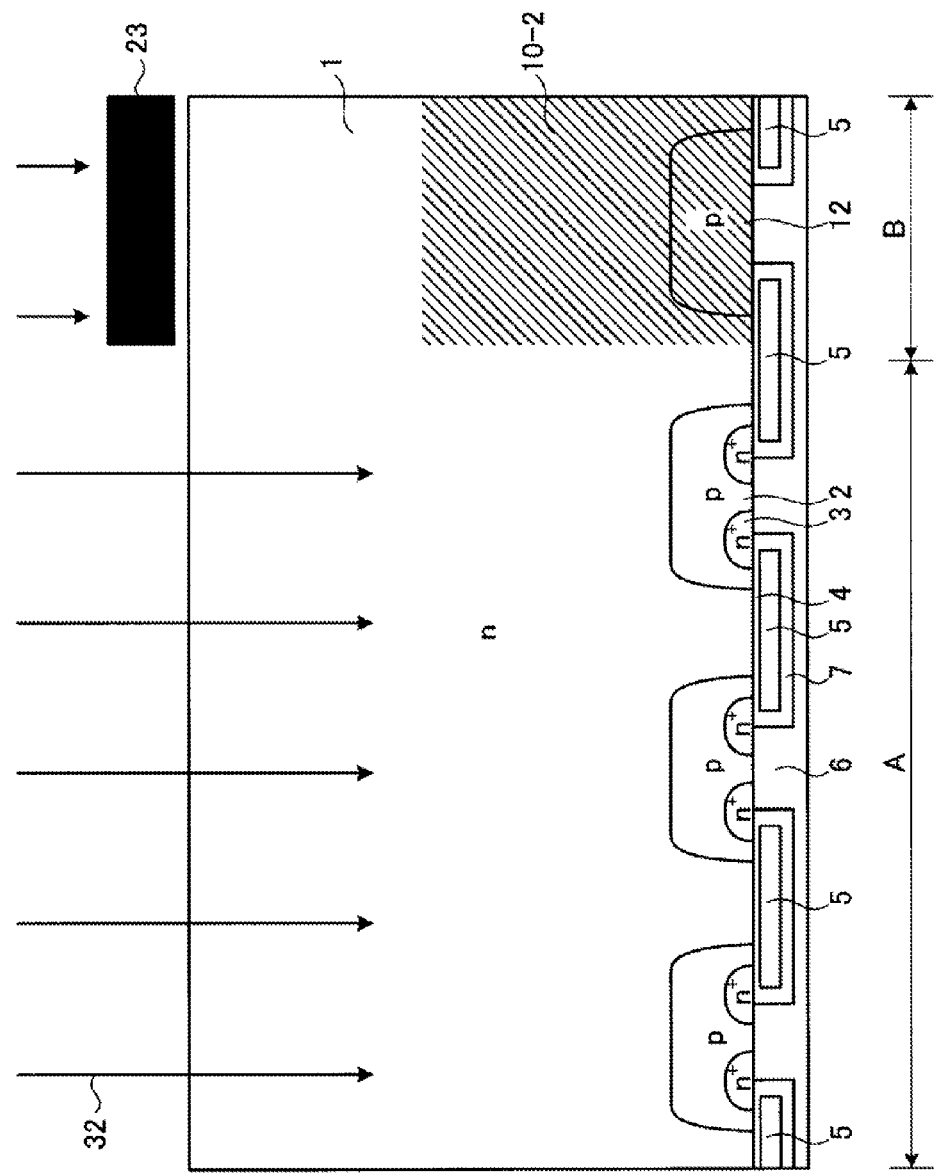
FIG. 7 is a cross sectional views showing the semiconductor device according to the embodiment 1 in being manufactured in the step subsequent to the step shown in FIG. 6.

Specifically, as is shown in FIG. 5, when using an absorber 22, after the absorber 22 is arranged above the first shielding mask 21 with a specified spacing apart therefrom, the FWD region B is irradiated with light ions 31 through the absorber 22, for example. By irradiating the FWD region B with the light ions 31 through the absorber 22, the range of the light ions 31 can be shortened depending on the thickness of the absorber 22. In FIGS. 4 and 5, the difference in the range of the light ions 31 is shown by the difference in length of the arrow representing the light ion 31. Thus, as is shown in FIG. 6, in the FWD region B, the second lifetime control region 10-2 is formed with a specified depth from the top surface side (anode side) of the semiconductor substrate. The range of the light ions 31 is determined so that the second lifetime control region 10-2 can be formed with the specified depth. Here, when the range of the light ions 31 is adjusted by adjusting only the acceleration voltage of the light ions 31, no absorber 22 can be used.

Next to this, the semiconductor substrate is turned with the bottom surface at the top. Then, a second shielding mask 23 is arranged above the bottom surface of the semiconductor substrate with a specified spacing, for example, apart from the semiconductor substrate to shield the FWD region B side on the bottom surface of the semiconductor substrate by the second shielding mask 23. The second shielding mask 23, like the first shielding mask 21, is made of a plate-like metallic material such as aluminum, for example. The second shielding mask 23 has an opening pattern (not shown) formed to be opened according to the plane layout in the IGBT region A. Namely, the opening pattern in the second shielding mask 23 becomes a pattern to which the opening pattern in the first shielding mask 21 is reversed. The alignment between the semiconductor substrate and the second shielding mask 23 is carried out by such a general method as to detect a mark (not shown) for alignment such as an orientation flat or an alignment mark formed on the semiconductor substrate by a camera (not shown).

Then, with the use of the second shielding mask 23, only the IGBT region A is irradiated with light ions 32 such as protons or helium ions, for example. This introduces lattice defects to be lifetime killers to a specified depth from the top surface of the semiconductor substrate only in the IGBT region A. The FWD region B shielded by the second shielding mask 23 is irradiated with no light ions 32. The range of the light ions 32 with which the IGBT region A is irradiated is, with the half width of a concentration distribution curve of the light ions 32 taken into consideration, preferably determined so that the peak position of the concentration distribution curve of the light ions 32 irradiating the IGBT region A comes within the region where the p$^+$-collector region 8 is formed, for example. This, even though the bottom surface of the semiconductor substrate is ground in a later process, allows the first lifetime control region 10-1 to be formed with a specified depth from the bottom surface of the semiconductor substrate after being ground.

Figure 8:
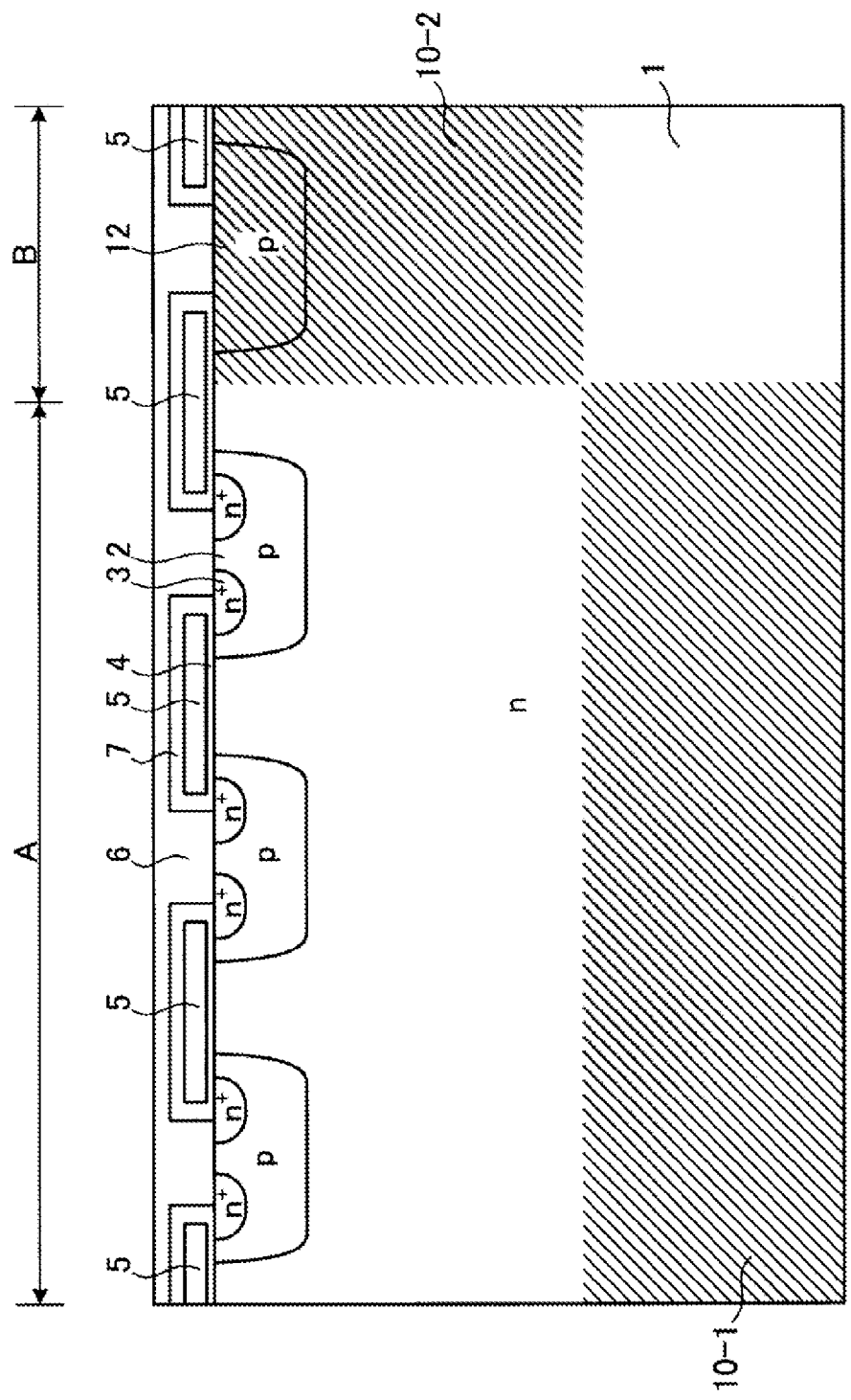
FIG. 8 is a cross sectional views showing the semiconductor device according to the embodiment 1 in being manufactured in the step subsequent to the step shown in FIG. 7.

Specifically, the range of the light ions 32 is preferably determined to be equal to the depth from the position at the bottom surface (0%) to the position on the order of 30% of the thickness of the semiconductor substrate after being ground in a later process. For adjusting the range of the light ions 32, the acceleration voltage of the light ions 32 when irradiating the semiconductor substrate can be adjusted or an absorber (not shown) can be used as was explained in the foregoing. By irradiating only the IGBT region A with light ions 32 in this way, as is shown in FIG. 8, in the IGBT region A, the first lifetime control region 10-1 is formed with a specified depth from the bottom surface of the semiconductor substrate.

Figure 9:
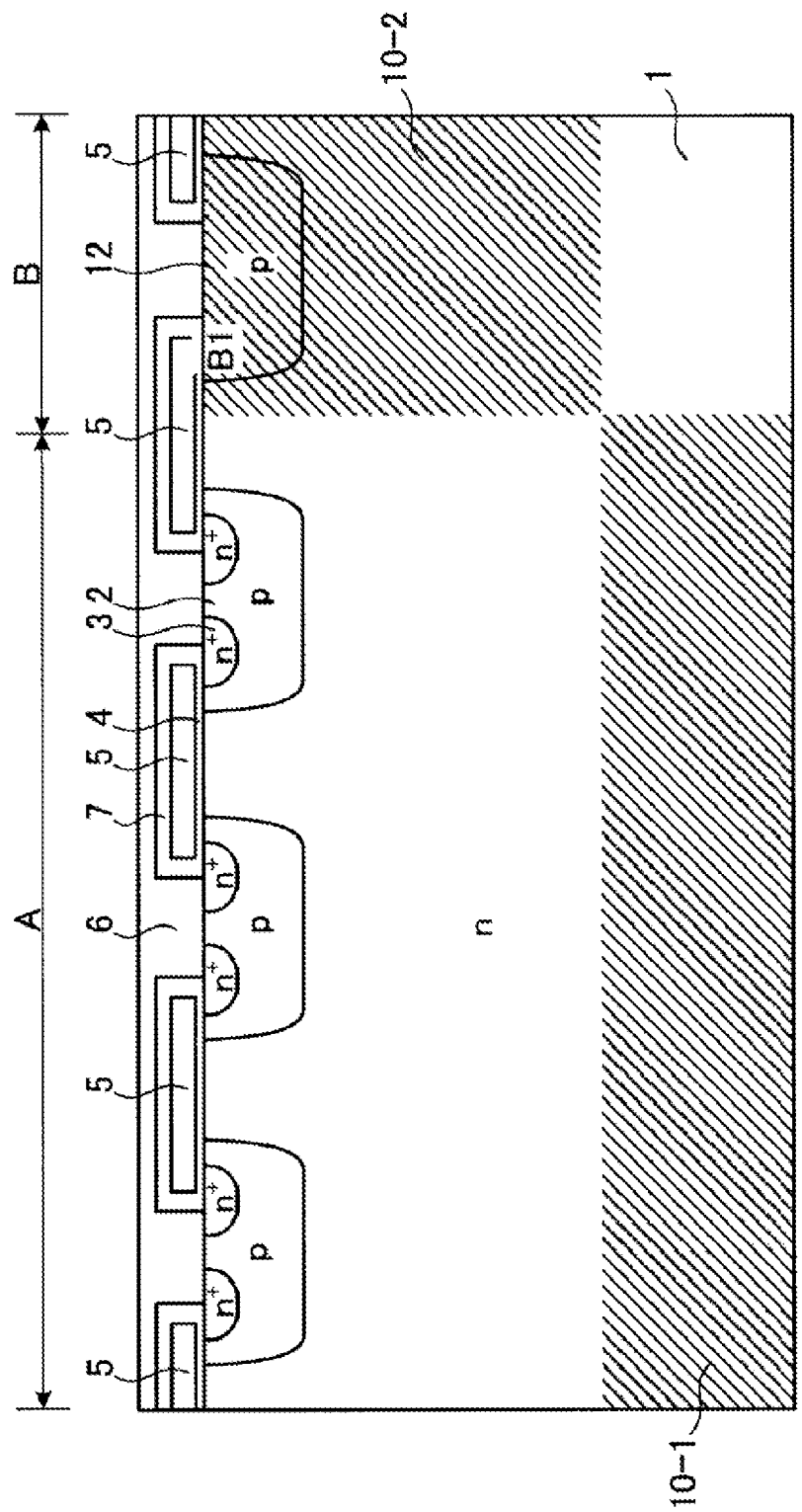
FIG. 9 is a cross sectional views showing the semiconductor device according to the embodiment 1 in being manufactured in the step subsequent to the step shown in FIG. 8.

Following this, for adjusting the lifetime of carriers by removing lattice defects which are introduced into the semiconductor substrate by the irradiation with the light ions 31 and 32, annealing is carried out for a time on the order of 1 hour at a temperature between 300° C. and 400° C., for example. Subsequent to this, as is shown in FIG. 9, the bottom surface of the semiconductor substrate is subject to grinding to be thinned. This permits the first lifetime control region 10-1 to be formed in the p$^+$-collector region 8 to be formed later or in the region including the p$^+$-collector region 8. Thereafter, by a general method, the p$^+$-collector region 8 is formed in the IGBT region A and the n$^+$-cathode region 18 is formed in the FWD region B. Then, by forming the collector electrode 9 in contact with the p$^+$-collector region 8 and the n$^+$-cathode region 18, the RC-IGBT shown in FIG. 1 is completed.

In the method of manufacturing the semiconductor device explained in the foregoing, the IGBT region A is irradiated with the light ions 32 after the FWD region B is irradiated with the light ions 31. The order of the irradiation, however, can be exchanged with each other so that the FWD region B is irradiated with the light ions 31 after the IGBT region A is irradiated with the light ions 32. Moreover in the method, annealing is carried out after the FWD region B and the IGBT region A are irradiated with the light ions 31 and the light ions 32, respectively. The annealing, however, can be carried out for each of the irradiation with the light ions 31 and the irradiation with the light ions 32. In addition, when using an absorber for adjusting each of the ranges of the light ions 31 and 32, with the use of a mask in which a shielding mask and an absorber are integrally formed, the shielding of the light ions and the adjustment of the range of the light ions may be carried out at the same time.

Also in the method of manufacturing the semiconductor device explained in the foregoing, the acceleration voltage and the amount of irradiation at the irradiation with the light ions 32 for forming the first lifetime control region 10-1 can be variously changed to the design criteria of the IGBT. Moreover, the acceleration voltage and the amount of irradiation at the irradiation with the light ions 31 for forming the second lifetime control region 10-2 can be variously changed to the design criteria of the FWD. Specifically, the acceleration voltages of the light ions 31 and 32 at the irradiation can be variously changed within the range from 1 MeV to 10 MeV, for example. The amounts of irradiation with the light ions 31 and the light ions 32 can be variously changed within the range from $1\times10^{11}/cm^2$ to $1\times10^{15}/cm^2$.

Figure 10:
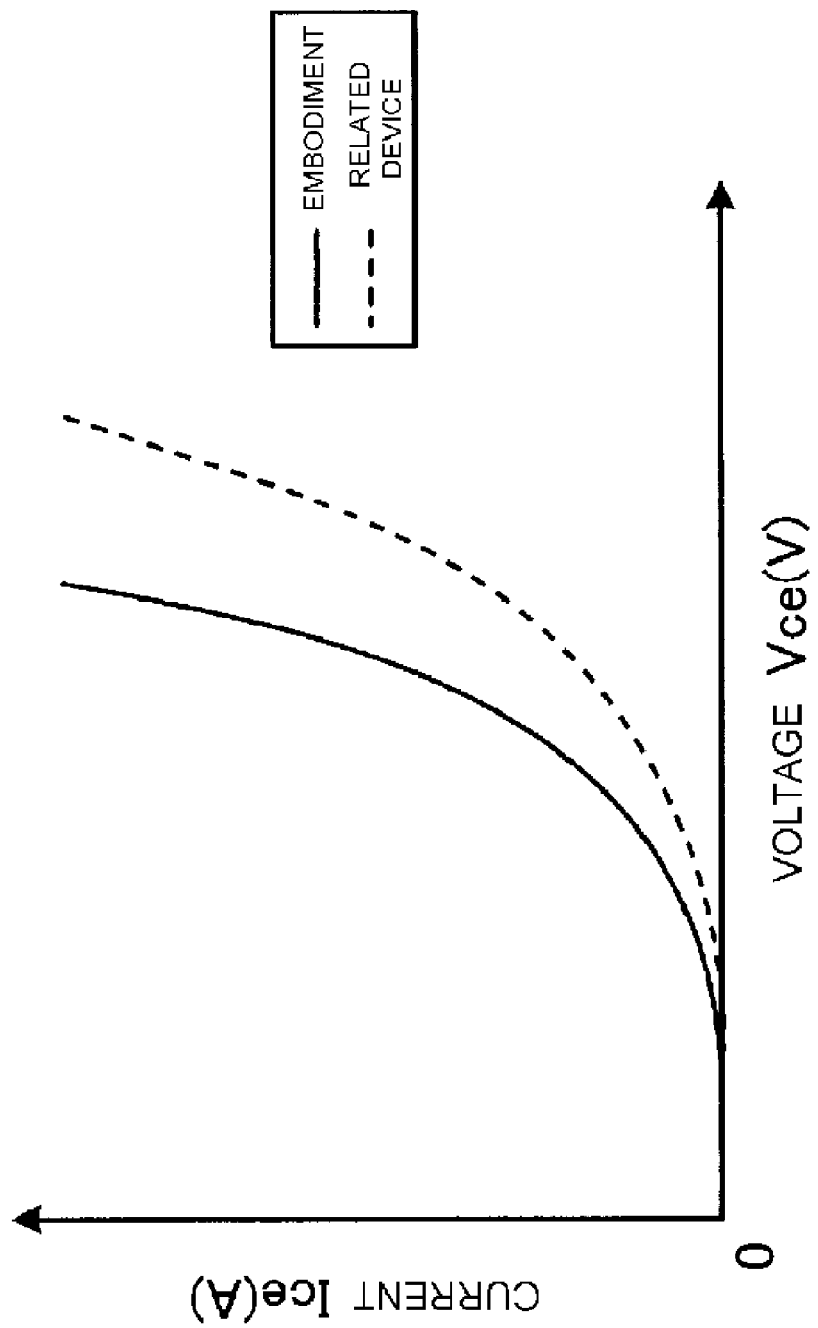
FIG. 10 is a characteristic diagram showing an on-voltage characteristic of the semiconductor device according to the embodiment 1.

Subsequent to this, an explanation will be made with respect to the on-voltage characteristic of the IGBT region A1-A2 in the RC-IGBT according to the embodiment 1. FIG. 10 is a characteristic diagram showing an on-voltage characteristic of the semiconductor device according to the embodiment 1. In FIG. 10, a solid line represents an on-voltage characteristic of the IGBT forming the RC-IGBT according to the embodiment 1 (hereinafter referred to as an embodiment). For comparison, the on-voltage characteristic of the IGBT forming the related RC-IGBT (related device) is also shown in FIG. 10 by a broken line. In the related device, as is shown by a dotted line in each of FIGS. 2A and 2B, the region in which the lifetime of carriers is uniformly short is provided from the IGBT region to the FWD region.

In the embodiment, by providing the first lifetime control region 10-1, the lifetime of carriers on the emitter side A1 becomes longer than the lifetime of carriers on the collector side A2. This, in a turned-on operation, enables the carrier concentration on the emitter side A1 to be higher than the carrier concentration on the collector side A2. Thus, an IE (Injection Enhancement) effect in the vicinity of the $n^+$-emitter region 3 is improved, by which an on-voltage can be lowered. While, in the related device, when the impurity concentration in the collector region is determined to be lower than that in the embodiment for lowering a turn-off loss to the extent equivalent to that of the embodiment, the amount of carrier injection is increased on the collector side to make it impossible to lower an on-voltage. Therefore, as shown in FIG. 10, in the embodiment, the on-voltage can be made lowered and the turning-off loss can be also made lowered.

Figure 11:
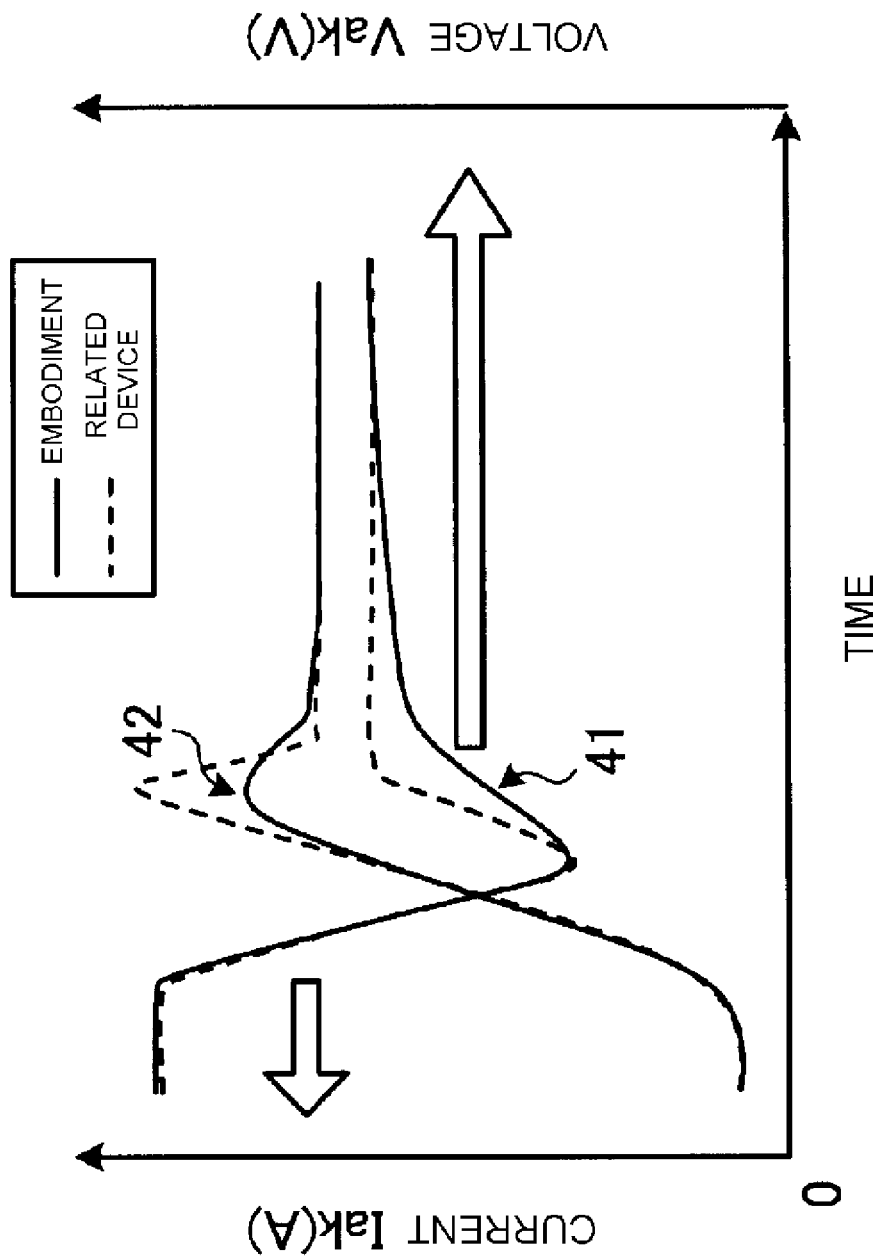
FIG. 11 is a characteristic diagram showing a reverse recovery characteristic of the semiconductor device according to the embodiment 1.

Following this, an explanation will be made with respect to the reverse recovery characteristic of the FWD region B1-B2 in the RC-IGBT according to the embodiment 1. FIG. 11 is a characteristic diagram showing a reverse recovery characteristic of the semiconductor device according to the embodiment 1. In FIG. 11, a solid line represents a reverse recovery waveform of the FWD forming the RC-IGBT according to the embodiment 1 (embodiment). For comparison, the reverse recovery waveform of the FWD forming the related RC-IGBT (related device) is also shown in FIG. 11 by a broken line. In the related device, as is shown by a dotted line in FIGS. 2A and 2B, the region in which the lifetime of carriers is uniformly short is provided from the IGBT region to the FWD region.

As is shown in FIG. 11, in the embodiment, by providing the second lifetime control region 10-2, the lifetime of the carriers on the anode side B1 becomes shorter than the lifetime of the carriers on the cathode side B2. This permits a reverse recovery current to have a reverse recovery waveform of a soft recovery with the rate of change of the current with respect to time di/dt being gentle (the part indicated by the numeral 41). This can lower a surge voltage Vpeak appearing at the reverse recovery (the part indicated by the numeral 42). While, in the related device, when the impurity concentration in the anode region 112 is determined to be lower than the impurity concentration in the anode region 12 in the embodiment for making the extent of a forward voltage drop Vf equivalent to that in the embodiment, a reverse recovery current is made to have a reverse recovery waveform of a hard recovery with the rate of change of the current with respect to time di/dt being large. This makes it impossible for the related device to lower a surge voltage Vpeak appearing at the reverse recovery. Thus, the embodiment becomes capable of reducing noises generated at switching.

As was explained in the foregoing, according to the embodiment 1, by irradiating the top surface of the semiconductor substrate with the light ions 31 with the use of the first shielding mask 21, the second lifetime control region 10-2 can be formed with the specified depth on the FWD region B side on the top surface of the semiconductor substrate. Furthermore, by irradiating the top surface of the semiconductor substrate with the light ions 32 with the use of the second shielding mask 23, the first lifetime control region 10-1 can be formed with the specified depth on the IGBT region A side on the bottom surface of the semiconductor substrate. This makes, in the IGBT region A, the lifetime of the carriers on the emitter side A1 become longer than the lifetime of the carriers on the collector side A2 and makes, in the FWD region B, the lifetime of the carriers on the anode side B1 becomes shorter than the lifetime of the carriers on the cathode side B2. Therefore, it is possible to carry out lifetime control under the optimum condition for each of the IGBT region A and the FWD region B. Namely, an RC-IGBT can be actualized which has a configuration in which in a turned-on operation, the carrier concentration on the emitter side A1 of the IGBT region A becomes higher than the carrier concentration on the collector side A2 and the carrier concentration on the anode side B1 of the FWD region B becomes lower than the carrier concentration on the cathode side B2. This, in the IGBT region A, allows carriers to be efficiently extracted at the switching to make it possible to lower a turn-off loss. In the FWD region B, the reverse recovery current exhibits soft recovery at a reverse recovery to reduce noises generated at switching. Therefore, in the RC-IGBT in which an IGBT and an FWD are provided in the same semiconductor substrate, a switching characteristic can be improved.

(Embodiment 2)

Figure 12:
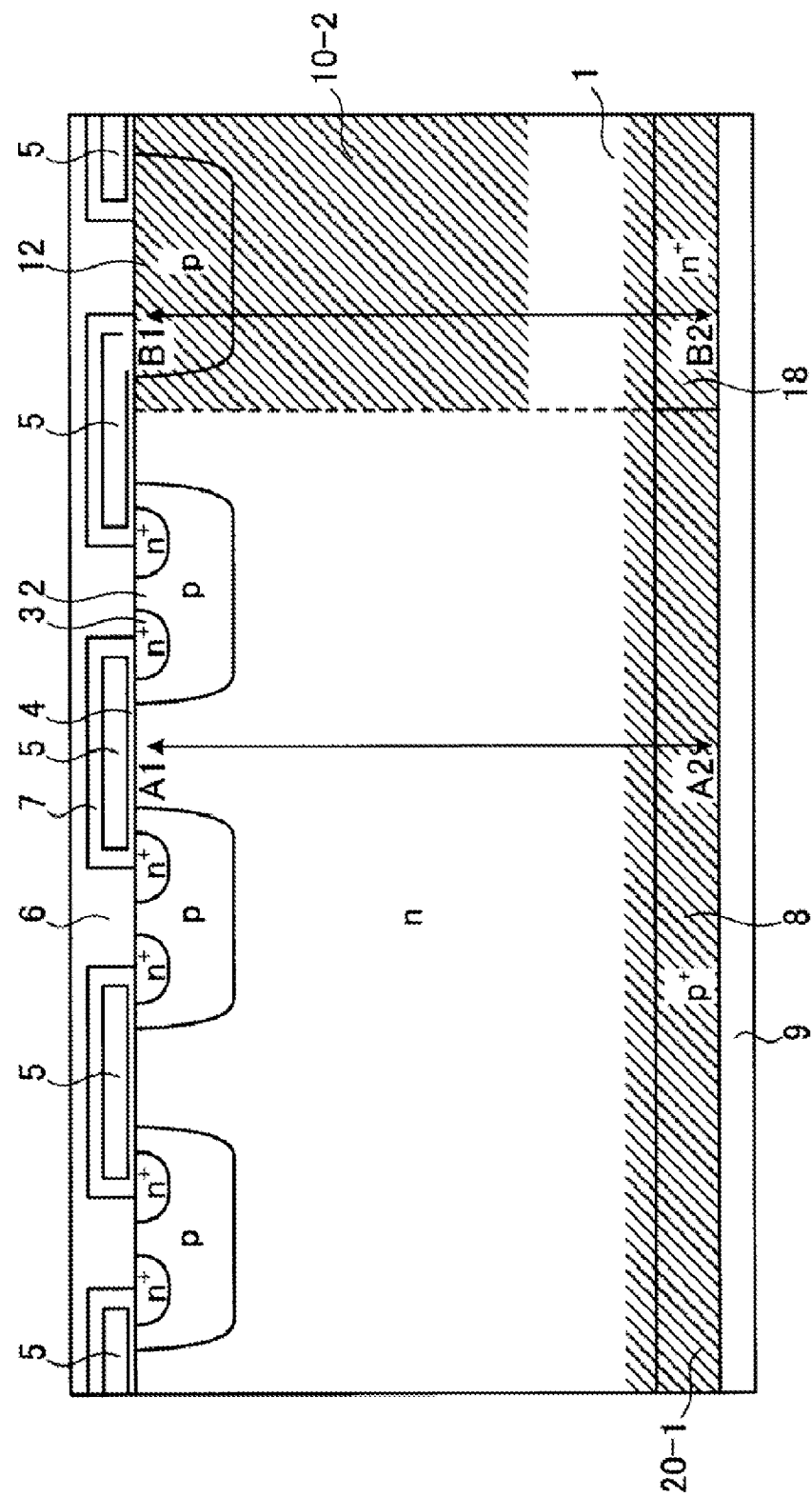
FIG. 12 is a cross sectional view showing a semiconductor device according to an embodiment 2.
Figure 13:
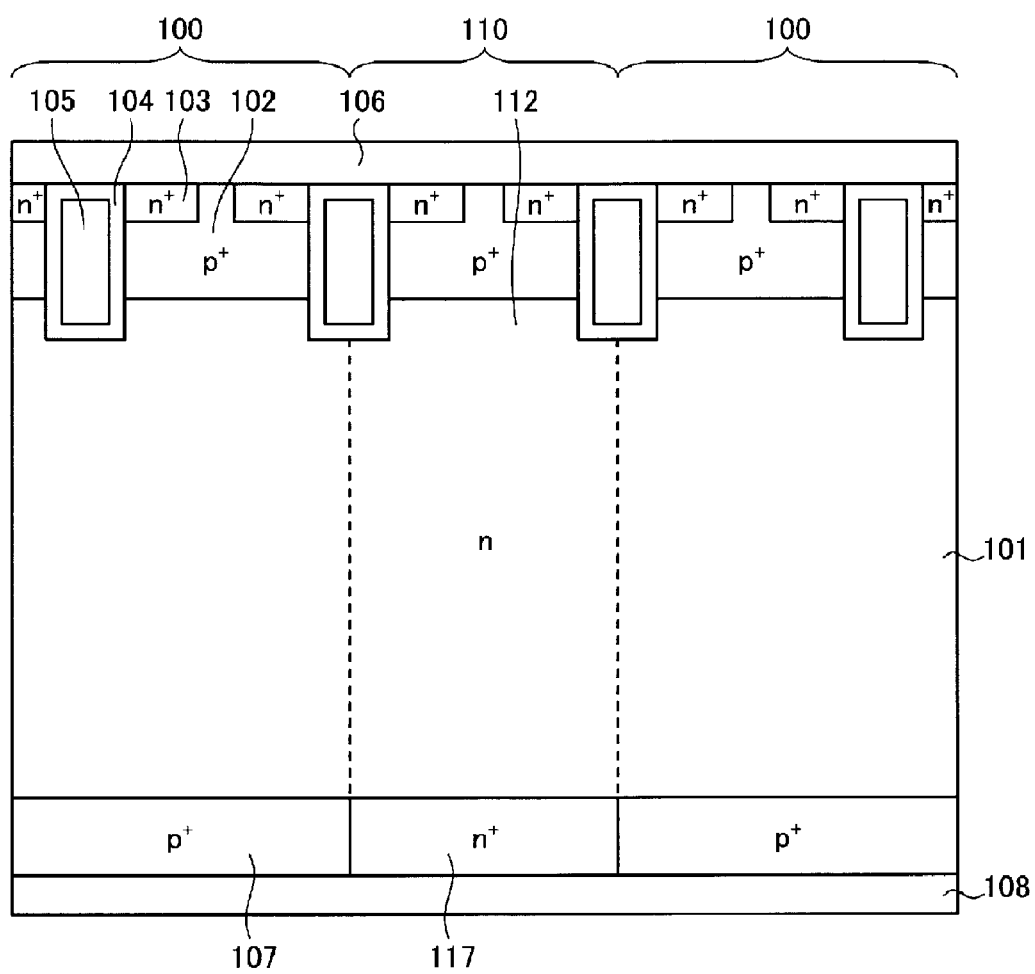
FIG. 13 is a cross sectional view schematically showing a related RC-IGBT as a related semiconductor device.

FIG. 12 is a cross sectional view showing a semiconductor device according to an embodiment 2. The method of manufacturing a semiconductor device according to the embodiment 2 differs from the method of manufacturing a semiconductor device according to the embodiment 1 in that a shielding mask is used only when the second lifetime control region 10-2 is formed. When hardly varying the lifetime of carriers in the IGBT region A1-A2, a first lifetime control region 20-1 can be uniformly provided from the IGBT region A1-A2 to the FWD region B1-B2.

Specifically, when the carrier concentration in the cathode side B2 can be kept to the extent that no reverse recovery current is brought into a hard recovery at the reverse recovery of the FWD even though the first lifetime control region 20-1 is provided on the cathode side B2 of the FWD region B1-B2, the first lifetime control region 20-1 can be uniformly provided from the IGBT region A1-A2 to the FWD region B1-B2. The configuration of the RC-IGBT according to the embodiment 2 other than the first lifetime control region 20-1 is the same as the configuration of the RC-IGBT according to the embodiment 1.

In the semiconductor device according to the embodiment 2, the whole bottom surface of the semiconductor substrate is irradiated with the light ions 32 without using the second shielding mask 23 (or the second shielding mask 23 and the absorber). Thus, over the collector side A2 of the IGBT region A1-A2 and the cathode side B2 of the FWD region B1-B2, the first lifetime control region 20-1 is formed. The method of manufacturing the semiconductor device according to the embodiment 2 other than the first lifetime control region 20-1 is the same as the method of manufacturing the semiconductor device according to the embodiment 1.

As was explained in the foregoing, according to the embodiment 2, the same advantage as that of the embodiment 1 can be obtained. With the method according to the embodiment 2, the first lifetime control region 20-1 can be formed without using the second shielding mask 23. Thus, the process of manufacturing the RC-IGBT can be simplified.

In the foregoing, the invention is explained with an RC-IGBT taken as each of the embodiments. The invention, however, is not limited to the embodiments explained in the foregoing, but can be applied to the cases in which various kinds of lifetime control are carried out on a plurality of elements provided on the same semiconductor substrate with the optimum conditions of the respective elements. Moreover, in the invention, a configuration can be provided in which a trench gate IGBT is provided as a substitute for the planar gate IGBT. In addition, in each embodiment, the first conduction type is made to represent the n-type and the second conduction type is made to represent the p-type. The invention, however, is similarly valid even when the first conduction type is made to represent the p-type and the second conduction type is made to represent the n-type.

As was explained in the foregoing, the method of manufacturing a semiconductor device according to the invention is useful for manufacturing power semiconductor devices used for electric power converters such as inverters and power supply systems for various kinds of industrial machines.

While the present invention has been particularly shown and described with reference to the preferred embodiments thereof, it will be understood by those skilled in the art that the foregoing and other changes in form and details can be made therein without departing from the spirit and scope of the present invention.

What is claimed is:

1. A method of manufacturing a semiconductor device having a first semiconductor element provided in a first region in a semiconductor substrate, and a second semiconductor element provided in a second region in the semiconductor substrate, the method comprising:
    preparing a light ion source, a first mask and a second mask;
    shielding a side of the first region on a top surface of the semiconductor substrate by using the first mask;
    irradiating the top surface of the semiconductor substrate, the side of the first region thereon being shielded with the first mask, with light ions by operating the light ion source to introduce lattice defects at a specified depth on a side of the second region on the top surface of the semiconductor substrate, wherein the lattice defects at the specified depth on the side of the second region define a first lifetime control region having a first edge under a gate electrode of the first semiconductor element, the gate electrode extending from the first region into the second region;
    shielding the side of the second region on a bottom surface of the semiconductor substrate by using the second mask; and
    irradiating the bottom surface of the semiconductor substrate, the side of the second region thereon being shielded with the second mask, with light ions by operating the light ion source to introduce lattice defects at a specified depth on the side of the first region on the bottom surface of the semiconductor substrate, wherein the lattice defects at the specified depth on the side of the first region define a second lifetime control region having a second edge under the gate electrode and are substantially co-planar with the first edge of the first lifetime control region.

2. The method of manufacturing a semiconductor device as claimed in claim 1, wherein in irradiating the top surface of the semiconductor substrate, a carrier lifetime on the side of a top surface element structure of the second semiconductor element is made shorter than a carrier lifetime on the side of a top surface element structure of the first semiconductor element.

3. The method of manufacturing a semiconductor device as claimed in claim 2, wherein the semiconductor substrate is a semiconductor substrate of a first conduction type which is provided with an insulated gate structure as the top surface element structure of the first semiconductor element, the insulated gate structure including a base region of a second conduction type, an emitter region of the first conduction type and the gate electrode, and is provided with an anode region of the second conduction type as the top surface element structure of the second semiconductor element, and
    in irradiating the top surface of the semiconductor substrate, the carrier lifetime on the side of the anode region is made shorter than the carrier lifetime on the side of the emitter region.

4. The method of manufacturing a semiconductor device as claimed in claim 3, wherein the semiconductor substrate of the first conduction type is provided with a cathode region of the first conduction type as the bottom surface element structure of the second semiconductor element, and
    in irradiating the top surface of the semiconductor substrate, the carrier lifetime on the side of the anode region is made shorter than the carrier lifetime on the side of the cathode region.

5. The method of manufacturing a semiconductor device as claimed in claim 1, wherein in irradiating the bottom surface of the semiconductor substrate, a carrier lifetime on the side of a bottom surface element structure of the first semiconductor element is made shorter than a carrier lifetime on the side of a bottom surface element structure of the second semiconductor element.

6. The method of manufacturing a semiconductor device as claimed in claim 5, wherein the semiconductor substrate of the first conduction type is provided with a collector region of the second conduction type as the bottom surface element structure of the first semiconductor element, and is provided with a cathode region of the first conduction type as the bottom surface element structure of the second semiconductor element, and
    in irradiating the bottom surface of the semiconductor substrate, the carrier lifetime on the side of the collector region is made shorter than the carrier lifetime on the side of the cathode region.

7. The method of manufacturing a semiconductor device as claimed in claim 6, wherein the semiconductor substrate of the first conduction type is provided with the insulated gate structure as the top surface element structure of the first semiconductor element, the insulated gate structure including a base region of a second conduction type, an emitter region of the first conduction type and the gate electrode, and
    in irradiating the bottom surface of the semiconductor substrate, the carrier lifetime on the side of the collector region is made shorter than the carrier lifetime on the side of the emitter region.

8. The method of manufacturing a semiconductor device as claimed in claim 1, wherein in each of irradiating the top surface of the semiconductor substrate and irradiating the bottom surface of the semiconductor substrate, the irradiation is carried out with a particle beam of one of protons and helium ions.

9. The method of manufacturing a semiconductor device as in claim 1, wherein a bottom edge of the first lifetime control region defining the specified depth of the first lifetime control region is co-planar with a top edge of the second lifetime control region defining the specified depth of the second lifetime control region.

10. The method of manufacturing a semiconductor device as in claim 1, further comprising adjusting a range of the light ions irradiated onto the top surface of the semiconductor substrate by providing an absorber between a light ion source and each of the first and second regions.

11. A method of manufacturing a semiconductor device having a first semiconductor element provided in a first region in a semiconductor substrate, and a second semiconductor element provided in a second region in the semiconductor substrate, the first region non-overlapping with the second region, the method comprising:
  preparing a light ion source and a first mask;
  shielding a side of the first region on a top surface of the semiconductor substrate by using the first mask;
  irradiating the top surface of the semiconductor substrate, the side of the first region thereon being shielded with the first mask, with light ions by operating the light ion source to introduce lattice defects at a specified depth on a side of the second region on the top surface of the semiconductor substrate, wherein the lattice defects at the specified depth on the side of the second region are introduced only into the second region; and
  irradiating the bottom surface of the semiconductor substrate with light ions without using a mask by operating the light ion source to introduce lattice defects at a specified depth on the side of the first region and second region on the bottom surface of the semiconductor substrate,
  wherein the irradiating the bottom surface and the top surface of the semiconductor substrate is performed to form a depth region at a predetermined depth spanning both the first region and the second region at which no lattice defects are formed.

12. The method of claim 11, wherein irradiating the bottom surface of the semiconductor substrate includes irradiating a portion corresponding to a collector of the first semiconductor element.

13. The method of claim 11, wherein the lattice defects at the specified depth on the side of the second region define a first lifetime control region having a first edge under a gate electrode of the first semiconductor element, the gate electrode extending from the first region into the second region.

* * * * *